United States Patent [19]

Shindo et al.

[11] 4,179,624
[45] Dec. 18, 1979

[54] CARRIER CONTROL METHOD BY USING PHASE-PULSE SIGNALS

[75] Inventors: Yoshio Shindo, Sagamihara; Takahiro Kimijima, Kokubunji; Hiroyasu Onishi, Yokohama; Masayasu Endo, Machida, all of Japan

[73] Assignees: The Tokyo Electric Power Co. Inc.; Osaki Electric Co., Ltd., both of Tokyo, Japan

[21] Appl. No.: 840,369

[22] Filed: Oct. 7, 1977

[30] Foreign Application Priority Data

Jan. 25, 1977 [JP] Japan .................................. 52/6396

[51] Int. Cl.² .......................................... G08C 19/24
[52] U.S. Cl. ..................... 307/3; 340/310 A
[58] Field of Search ............... 307/3, 27; 340/310 A, 340/310 CP

[56] References Cited

U.S. PATENT DOCUMENTS

| 3,011,102 | 11/1961 | Balan | 317/149 |
| 3,482,243 | 12/1969 | Buschbaum | 340/408 |
| 3,488,517 | 1/1970 | Cowan | 307/3 |
| 3,721,830 | 3/1973 | Oishi | 307/3 |
| 3,803,491 | 4/1974 | Osborn | 340/310 A |
| 4,012,734 | 3/1977 | Jagoda | 340/310 A |

FOREIGN PATENT DOCUMENTS

| 1092638 | 11/1967 | United Kingdom . |
| 1153908 | 6/1969 | United Kingdom . |
| 1270233 | 4/1972 | United Kingdom . |
| 1400477 | 7/1975 | United Kingdom . |

OTHER PUBLICATIONS

Flexible Control for Street Lighting, Electrical Times, 6-13-68, pp. 973-974.
Data Transmission Over Distribution Systems, Electrical Times, 3-12-70, pp. 55-58.
Remote-Control and Communications Systems, J. W. Townsend, Electronic Engineering, Oct. 1970, pp. 67-71.

Primary Examiner—L. T. Hix
Assistant Examiner—S. D. Schneyer
Attorney, Agent, or Firm—Haseltine, Lake & Waters

[57] ABSTRACT

A carrier control method using phase-pulse signals in which a plurality of terminal-selection channels and a plurality of returning channels having a predetermined phase width respectively are provided in one cycle of an alternating current carrier wave. At the center, a terminal-selection phase-pulse signal comprising a combination of existence and non-existence of a phase pulse for each terminal-selection channel is injected in the terminal-selection channels, corresponding to a code assigned to each terminal equipment. At the terminal equipment, the terminal-selection phase-pulse signal is received. When the code of the signal coincides with the code of the terminal equipment, a returning phase-pulse signal comprising a combination of existence and non-existence of a phase pulse for each returning channel is injected in the returning channels, corresponding to a datum stored at the terminal in the electrically readable state, and the signal is received at the center.

4 Claims, 4 Drawing Figures

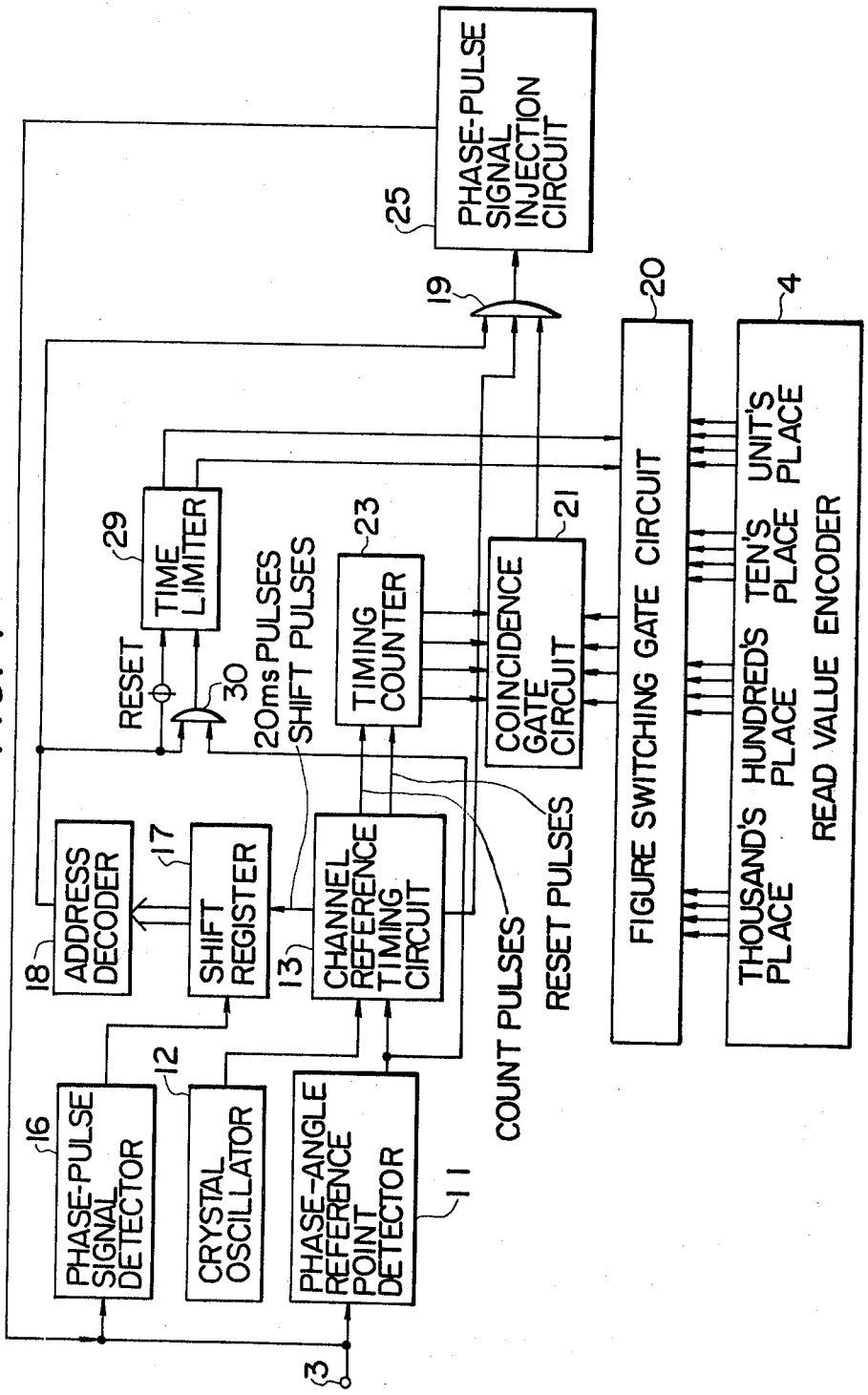

4,179,624

CARRIER CONTROL METHOD BY USING PHASE-PULSE SIGNALS

BACKGROUND AND FIELD OF THE INVENTION

The present invention relates to a carrier control method using phase-pulse signals which control terminal equipment, by establishing a plurality of channels having a predetermined phase width respectively in one cycle of an alternating current carrier wave of a commercial frequency on low voltage distributing lines and the like, and by injecting the phase-pulse signal in said channels.

PRIOR ART

The carrier control method is suited for automatically reading a watt-hour meter installed in each customer facility. In the prior art of automatic meter reading by this method, a terminal equipment transmits one unit of phase pulses per unit amount of energy consumption by the customer, and the receiver side counts the units of phase pulses and memorizes the result as an automatically readable read value. One unit of phase-pulses refers to a succession of phase-pulses on the same channel of every cycle for several seconds. In this case, however, since the read value is not stored in the terminal equipment, and one unit of phase-pulses is transmitted every time a unit amount of energy is consumed, the units of phase-pulses per unit amount of consumption by individual customers which are generated at random might be frequently overlapped when the conditions of the distributing lines are bad (for example, the loads are too large, adverse noise due to switching on the lines etc.), causing transmission failures. If errors are introduced in counting and memory of the read value in the receiver by the transmission failures, they are gradually accumulated over a long period, and cannot be automatically corrected. To prevent this, it is desirable that the read datum of electric energy is stored in the watt-hour meter or in the terminal equipment in the electrically readable state, and the read datum is transmitted when the conditions of the low voltage distributing lines are good.

SUMMARY OF THE INVENTION

A primary object of the present invention is to provide a carrier control method using phase-pulse signals, wherein the datum which is stored in the terminal in the electrically readable state can be transmitted to the center, in response to a command from the center.

Another object of the present invention is to provide a carrier control method using phase-pulse signals, wherein the datum of a plurality of figures stored in the terminal in the electrically readable state can be transmitted by a small number of channels.

A further object of the present invention is to provide a carrier control method using phase-pulse signals wherein discrimination of abnormal conditions of transmitted datum is easy and circuits which convert the datum to the phase-pulse signal can be simplified.

In the present invention, a plurality of terminal-selection channels and a plurality of returning channels are at least established in one cycle of an alternating current carrier wave. When the terminal equipment has received a terminal-selection phase-pulse signal, a returning phase-pulse signal comprising the combination of existence and non-existence of a phase-pulse of individual returning channels is injected in the returning channels of the alternating current carrier wave at the terminal equipment, corresponding to a datum stored in the terminal in the electrically readable state. Hence, the datum stored in the terminal can be transmitted to the center in response to a command from the center. Therefore, the datum can be transmitted to the center without transmission errors by transmitting the command from the center when the conditions of the carrier lines are good.

Furthermore, in the present invention, since a plurality of figure-selection channels are also established in one cycle of the alternating-current carrier wave, a figure-selection phase-pulse signal is injected in the figure-selection channels toward the terminal equipment from the center, the figure of the datum of a plurality of figures is designated, and the value of designated figure is transmitted by the returning phase-pulse signal; the datum on a number of figures can be transmitted by a small number of returning channels.

Furthermore, in the present invention since the value of each figure of the datum in a plurality of figures is sequentially transmitted figure by figure for every predetermined period by the returning phase-pulse signal, the datum in a number of figures can be transmitted by a much smaller number of channels.

Furthermore, in the present invention, since the returning channels consist of 10 channels corresponding to decimal numbers, and the value of the figure of the datum which is selected for returning is transmitted in decimal number, the returning phase-pulse signal is superposed on only one of the 10 returning channels. Therefore, if the phase-pulses are superposed on two or more returning channels, or if no phase-pulse is superposed on any returning channel, the condition is instantly judged as abnormal, hence it is easy to discriminate the abnormal datum that are transmitted. Moreover, the number of the returning channels is counted, and the phase-pulse is injected in the returning channel whose number coincides with the value of the figure, which is selected for returning among the figures of the datum of the decimal number. Therefore, only one coincidence gate circuit is needed to detect the coincidence of the number of the channels and the value of the datum, whereby a circuit for converting the datum into the phase-pulse signal can be simplified.

BRIEF DESCRIPTION OF THE DRAWINGS

FIG. 4 is a block diagram of terminal equipment according to another embodiment of the invention.

DETAILED DESCRIPTION

Figure 1:
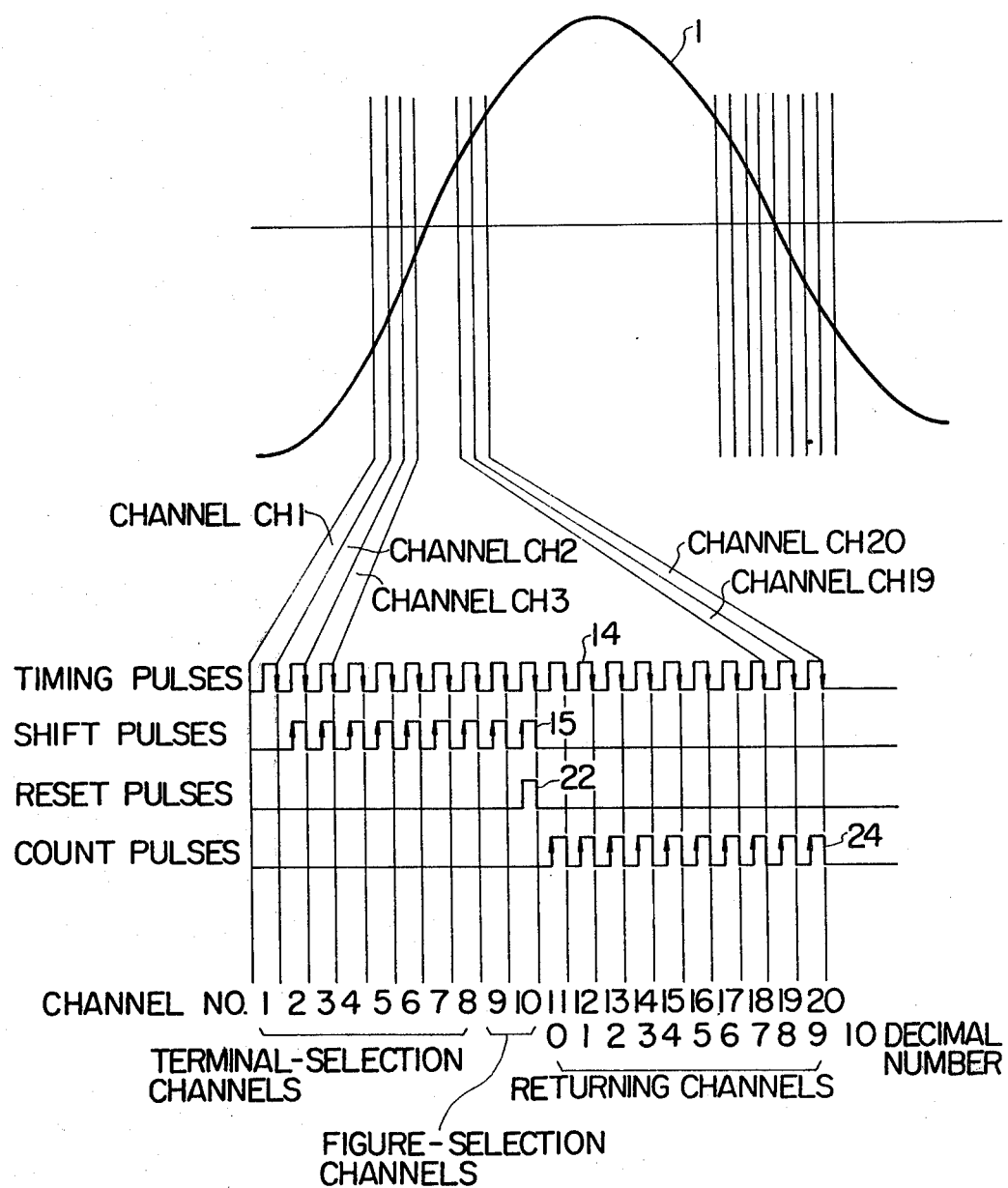
FIG. 1 is a channel timing chart according to one embodiment of the invention.
Figure 2:
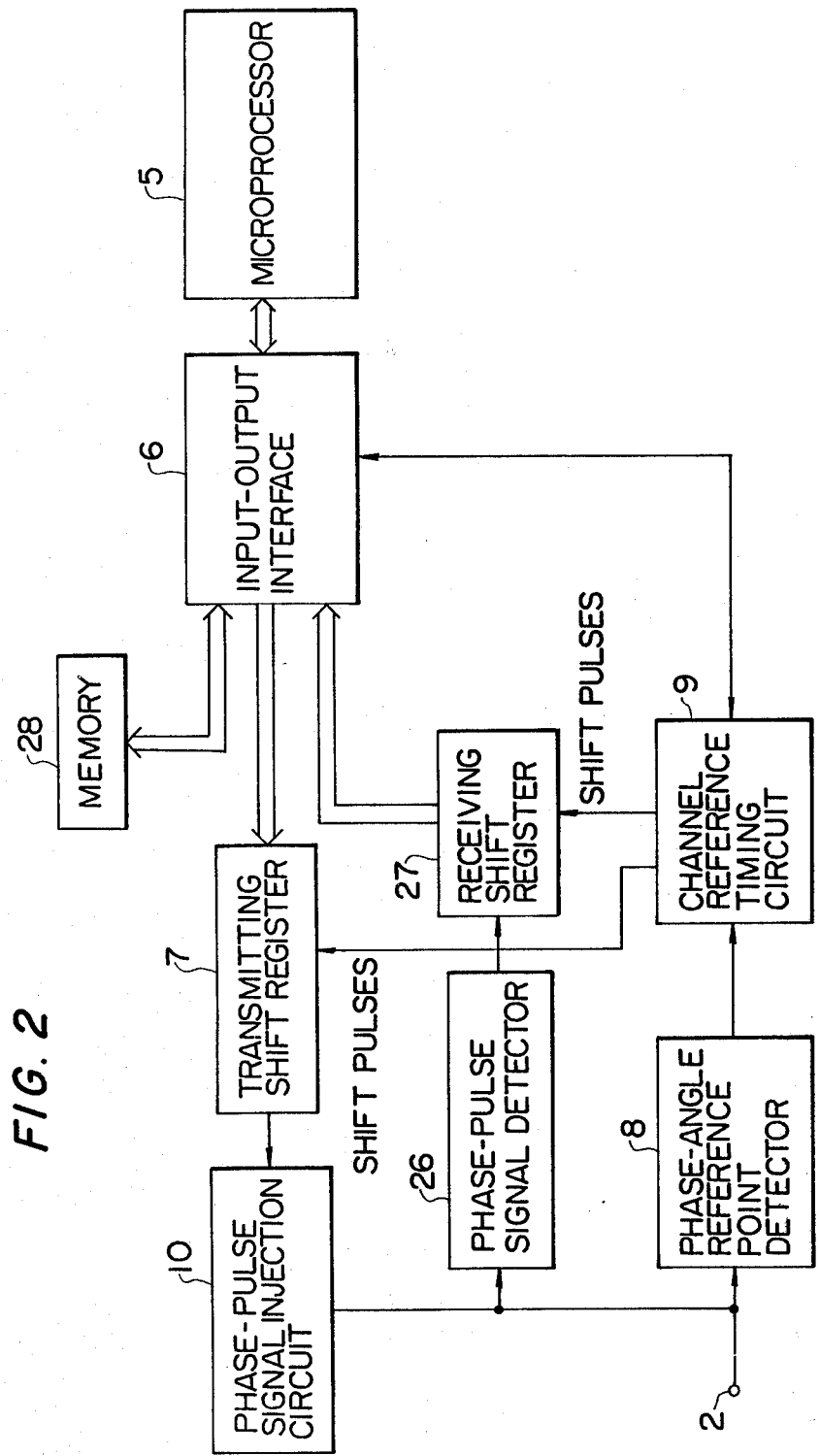
FIG. 2 is a block diagram of a central receiver according to one embodiment of the invention.
Figure 3:
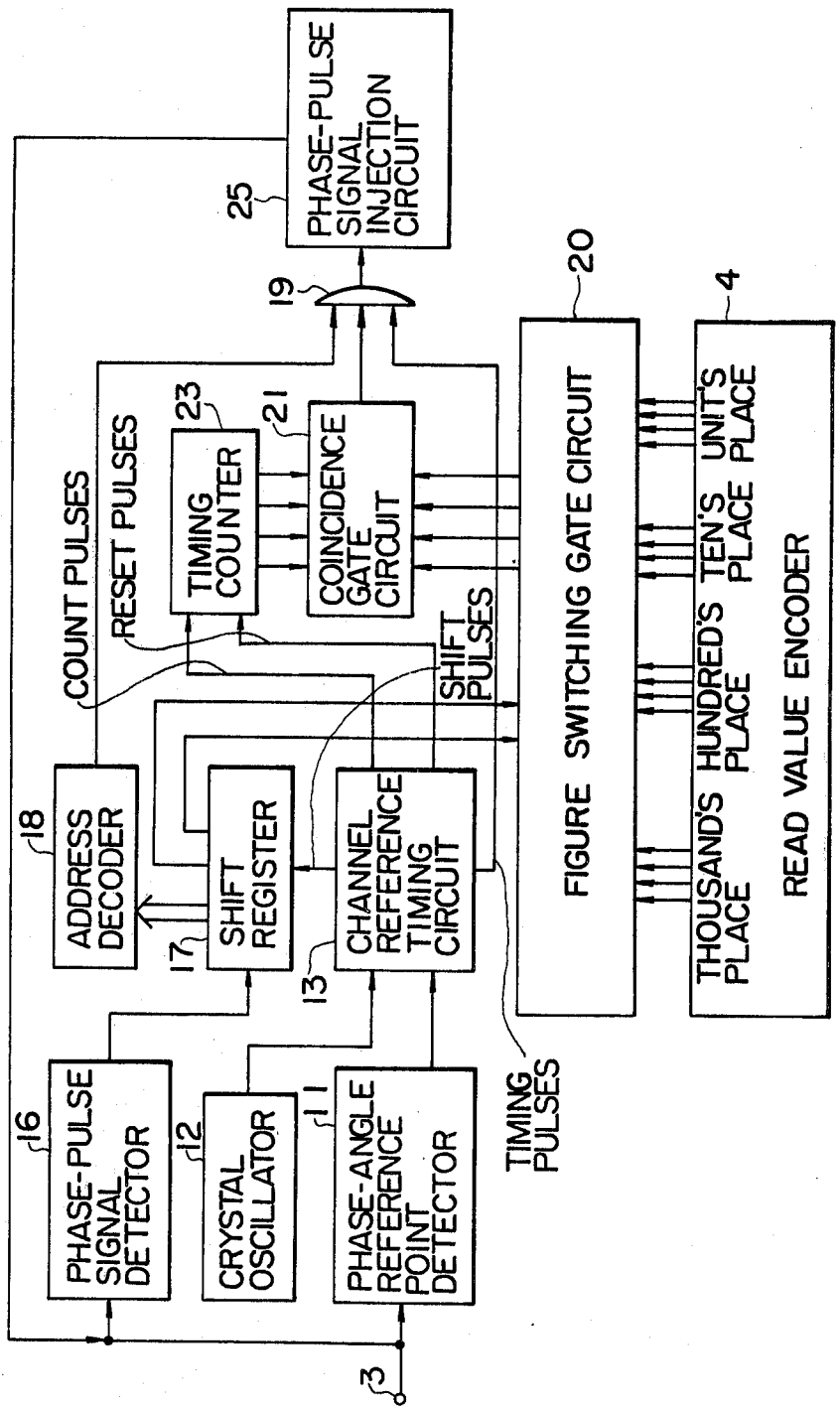
FIG. 3 is a block diagram of terminal equipment.

The automatic meter reading method according to the invention will be described hereinafter with reference to the drawing. As illustrated in FIG. 1, 20 channels CH1 to CH20 having respective predetermined phase widths are established in the vicinity of zero phase or $\pi$ phase, which is the low noise region of the commercial frequency wave 1 of low-voltage distribution lines. The channels CH1 to CH8 are assigned to the terminal-selection channels, the channels CH9 to CH10 to the figure-selection channels, and the channels CH11 to CH20 to the returning channels corresponding to the decimal numbers 0 to 9. FIG. 2 is a block diagram of the receiver provided in the center, and FIG. 3 is a block diagram of the terminal equipment provided for each customer. The terminal 2 in the receiver and the terminal 3 in the terminal equipment are connected to the low-voltage distributing lines respectively. The read value encoder 4 in the terminal equipment stores the measured value of a watt-hour meter in the electrically readable state, and sends out the four-figures measured value in the binary-coded decimal number. If an electronic watt-hour meter is used, the read value encoder 4 is not required, because the electronic watt-hour meter itself sends out the binary-coded decimal number. When the datum stored in the read value encoder 4 is read out at the center, in the receiver the selection code of the terminal equipment which is going to read out the datum and the read-out figure designation code are sent out in matched timed relation to the transmitting shift register 7 through the input-output interface 6 by the program action of the microprocessor 5. As for the selection codes, for instance, 10000000 is assigned to the first terminal equipment, and 01000000 to the second terminal equipment. The number of bits for the selection code can be 8 bits if the number of customers is 255 or less. But if it is more than 255, the number of bits must be increased, and the number of terminal-selection channels must be increased according to the same number of the bits. As for the read-out figure designation code; 00,01,10, and 11 are assigned to the place of thousands, hundreds, tens, and units respectively, in case the datum consists of four figures. As for timing, timing pulses are generated in the channel reference timing circuit 9 for each channel of CH1 to CH20 based on the phase angle reference points (phase of zero, $\pi$, or $\pi/2$, $3\pi/2$) on the commercial frequency wave 1, which are detected by the phase-angle reference point detector 8. The timing pulses are input into the microprocessor 5, where the timing is made. The selection code and the read-out figure designation code which are input into the transmitting shift register 7 are transmitted to the phase-pulse signal injection circuit 10 by the shift pulses from the channel reference timing circuit 9. The phase pulses are injected in the terminal-selection channels CH1 to CH8 of the commercial frequency wave 1, corresponding to the selection code. Thus, the coded terminal-selection phase-pulse signal comprising the combination of existence and non-existence of the phase pulse is formed and carried. Likewise, the phase pulses are injected in the figure-selection channels CH9 and CH10 corresponding to the read-out figure designating code (but if the read-out figure designating code is 00, the phase-pulses are not injected in the figure-selection channels CH9 and CH10), and thus the coded figure-selection phase-pulse signal comprising the combination of existence and non-existence of the phase pulse is formed and carried.

In the terminal equipment, the reference point of the commercial frequency wave 1 is detected by the phase-angle reference point detector 11, and the timing pulses 14 (in FIG. 1) and shift pulses 15 are generated by the channel reference timing circuit 13 which receives pulses from the crystal oscillator 12. The distance between one wave front and the next wave front of the timing pulse 14 determines the phase width of one channel. The terminal-selection phase-pulse signal and the figure-selection phase-pulse signal which are carried by the commercial frequency wave 1 are detected by the phase-pulse signal detector 16 and returned to the original selection code and the read-out figure designation code, which in turn are input to the shift register 17, timed by the shift pulses 15 from the channel reference timing circuit 13. The selection code is sent to the address decoder 18, which opens the terminal selection gate 19 when the selection code coincides with the address code in the terminal equipment. The read-out figure designation code is transmitted from the shift register 17 to the figure switching gate circuit 20. The value (binary-coded decimal number) of the designated figure of the datum stored in the read value encoder 4 is transmitted to the coincidence gate circuit 21 through the figure switching gate circuit 20. Meanwhile, the channel reference timing circuit 13 sends a reset pulse 22 to the timing counter 23 and resets it before the returning channels CH11 to CH20 arrive. When the returning channels CH11 to CH20 arrive, one count pulse per each channel is sent to the timing counter 23 by the channel reference timing counter 13. The timing counter 23 counts the count pulses 24, and sends the resultant measured value to the coincidence gate circuit 21 in the binary-coded decimal number. When the measured value of the timing counter 23 coincides with the value of the selected figure of the datum, the coincidence gate circuit 21 sends the output to the phase-pulse signal injection circuit 25 through the terminal selection gate 19. The phase-pulse signal injection circuit 25 injects the phase pulse into the returning channel at the time. For example, suppose the value of the designated figure of the datum is 3. Then, the code which is input to the coincidence gate circuit 21 from the figure switching gate circuit 20 is 0011 in the binary-coded decimal number. When the timing counter 23 counts the three count pulses, the measured value of the timing counter becomes 3, its binary-coded decimal number becomes 0011, and the coincidence gate circuit 21 actuates the phase-pulse signal injection circuit 25. Then, the phase of the commercial frequency wave 1 is channel CH14, into which the phase pulse is injected. Since the channel CH14 is assigned to the value 3, the returning phase-pulse signal denoting the decimal number 3 is formed by injecting the phase pulse only in the channel CH14 among the channels CH11 to CH20, and is transmitted to the receiver.

In the central receiver, the returning phase-pulse signal is detected by the phase-pulse signal detector 26, is returned back to the decimal code, and is input to the receiving shift register 27, timed by the shift pulses from the channel reference timing circuit 9. The code which is input to the receiving shift register 27 is processed by the microprocessor 5 and stored in the memory 28. Since the returning phase-pulse signal is expressed in decimal code, the phase-pulse is superposed only on one channel among 10 returning channels CH11 to CH20. If the phase pulses are superposed on two or more returning channels or if no phase pulse is superposed on any returning channel, abnormal processing is made by the microprocessor 5. The number of the returning channels is counted by the timing counter 23. When the counted number of the channels coincides with the output value from the figure switching gate circuit 20, it is detected by the coincidence gate circuit 21. The phase pulse is then injected in the returning channel corresponding to the value of the datum. Therefore, only one coincidence gate circuit is required, and the circuit for converting the datum into a phase-pulse signal can be simplified. In case the value of the selected figure of the datum is to be returned in the binary-coded decimal number, four coincidence gate circuits are required. In the case where the datum of four figures are to be returned to the pure binary number by 15 returning channels at one time, 15 coincidence gate circuits are required.

In the above described embodiment, the returning channels consist of 10 channels corresponding to the decimal number, and the value of the selected figure of the datum to be returned is returned in the decimal number. But it can be returned in the binary-coded decimal number or in the pure binary number, or the like. In case the binary-coded decimal number is used, only 4 returning channels are required. In case the pure binary number is used, since the value of 4 figures can be included up to $2^{14}(=16,384)$, the datum of 4 figures can be returned at one time if 15 returning channels are used.

FIG. 4 illustrates a block diagram of terminal equipment used in another embodiment of the present invention. Parts similar to those shown in FIG. 3 are represented by the same symbols. This embodiment returns the value of each figure of the 4-figures datum, which is stored in the read value encoder 4, sequentially for a predetermined period. Therefore the figure-selection phase-pulse signal and the figure-selection channels are not required. When the datum is read out at the center, the terminal-selection phase-pulse signal is transmitted from the receiver to the terminal equipment. When it is received, and the selection code coincides with the address code, the output of the address decoder 18 opens the terminal selection gate 19, and releases the reset of the time limiter 29. Then the time limiter 29 sends the figure-selection signal (e.g. 00), which selects the thousand's place, to the figure switching gate circuit 20 for a predetermined period, during which the value of the datum at the thousand's place is converted into the returning phase-pulse signal and transmitted. From the phase-angle reference point detector 11, one pulse per cycle, i.e., a pulse of 20 ms (duty cycle), is sent to the time limiter 29 through an AND gate 30. After a predetermined time has elasped, the time limiter 29 sends the figure-selection signal (e.g. 01), which selects the hundred's place, to the figure switching gate circuit 20 for a predetermined period, during which the value of the datum at the hundred's place is converted into the returning phase-pulse signal and transmitted. The value of the ten's place of the datum is selected at the next predetermined period, and the value of the unit's place of the datum at the last predetermined period. For instance, if 3 seconds are assigned to a predetermined period, the terminal-selection phase-pulse signal is transmitted from the receiver to one terminal equipment for 12 seconds. The 12 seconds are divided by 4 and the resultant 3 seconds is assigned to each figure of the 4 figures, and the returning phase-pulse signal corresponding to the value of each figure is returned for 3 seconds. The time limiter 29 is reset when the output of the address decoder 18 is not sent out.

What is claimed is:

1. A carrier control method using phase-pulse signals comprising forming a plurality of terminal-selection channels, a plurality of figure-selection channels, and a plurality of returning channels having a respective predetermined phase width in one cycle of an alternating-current carrier wave; each of said returning channels being assigned a particular figure value; inserting a terminal-selection phase-pulse signal comprising a coded combination of the existence and the non-existence of a phase pulse of each terminal-selection channel in the terminal-selection channels of the alternating current carrier wave, corresponding to a code assigned to each terminal equipment at the center; inserting a figure-selection phase-pulse signal comprising a coded combination of the existence and the non-existence of a phase pulse of each figure-selection channel in the figure-selection channels of the alternating-current carrier wave, corresponding to a code which designates a figure of a datum of a plural number of figures stored in the terminal in the electrically readable state, also at the center; receiving the terminal-selection phase-pulse signal at the terminal equipment; inserting a returning phase-pulse signal comprising the existence and the non-existence of a phase pulse on only one of the returning channels of the alternating-current carrier wave at the terminal equipment, corresponding to the value of the designated figure of the datum memorized in the terminal, when a code of the terminal-selection phase-pulse signal coincides with the code of the terminal equipment; and receiving said returning phase-pulse signal at the center; the transmission of said terminal-selection phase-pulse signal and said figure-selection phase-pulse signal and the return of the returning phase-pulse signal being made for every figure of the datum stored in the terminal.

2. A carrier control method using phase-pulse signals comprising forming a plurality of terminal-selection channels and a plurality of returning channels having a respective predetermined phase width in one cycle of an alternating-current carrier wave; each of said returning channels being assigned a particular figure value; inserting a terminal-selection phase-pulse signal comprising a coded combination of the existence and the non-existence of a phase pulse of each terminal-selection channel in the terminal-selection channels of the alternating-current carrier wave at the center, corresponding to a code assigned to each terminal equipment; receiving said terminal-selection phase-pulse signal at the terminal equipment; sequentially inserting a returning phase-pulse signal comprising a combination of the existence and the non-existence of a phase pulse of each returning channel in the returning channels of the alternating current carrier wave for every predetermined period per figure at the terminal equipment, corresponding to the value of each figure of a datum of a plurality of figures stored in the terminal in the electrically readable state when a code of the terminal-selection phase-pulse signal coincides with the code of the terminal equipment; and receiving said returning phase-pulse signal at the center.

3. A carrier control method using phase-pulse signals in accordance with claim 1 wherein the plurality of returning channels are 10 returning channels corresponding to a decimal number, the number of the returning channels is counted at the terminal equipment when a code of the terminal-selection phase-pulse signal coincides with the code of the terminal equipment, and a phase pulse is inserted in a returning channel whose counted number is coincident with the value of a figure which is selected for returning among the figures of a datum of the decimal number.

4. A carrier control method using phase-pulse signals in accordance with claim 2 wherein the plurality of returning channels are 10 returning channels corresponding to a decimal number, the number of the returning channels is counted at the terminal equipment when a code of the terminal-selection phase-pulse signal coincides with the code of the terminal equipment, and a phase-pulse is inserted in a returning channel whose counted number is coincident with the value of a figure which is selected for returning among the figures of a datum of the decimal number.

* * * * *